United States Patent [19]

Okazaki

[11] 3,813,615

[45] May 28, 1974

[54] LOCAL OSCILLATOR FOR TELEVISION TUNER HAVING REDUCED OSCILLATION VOLTAGE VARIATION BETWEEN HIGH AND LOW FREQUENCY BANDS

[75] Inventor: Mitsunari Okazaki, Soma, Japan

[73] Assignee: Alps Electric Co., Ltd., Tokyo, Japan

[22] Filed: July 13, 1973

[21] Appl. No.: 379,115

[30] Foreign Application Priority Data

July 28, 1972 Japan ................................ 47-75683

[52] U.S. Cl. .......... 331/109, 331/117 R, 331/177 V, 331/183, 334/15

[51] Int. Cl. .......................... H03b 3/02, H03b 5/12

[58] Field of Search ........ 331/109, 117 R, 182, 183, 331/177 V; 325/453, 457; 334/15

[56] References Cited

UNITED STATES PATENTS

| | | | |
|---|---|---|---|
| 3,354,397 | 11/1967 | Wittig | 325/453 X |
| 3,611,154 | 10/1971 | Kupfer | 334/15 X |
| 3,723,906 | 3/1973 | Pederson | 331/109 X |

*Primary Examiner*—Herman Karl Saalbach
*Assistant Examiner*—Siegfried H. Grimm

[57] ABSTRACT

A local oscillator circuit for a television tuner or the like includes a transistor and an oscillatory circuit connected thereto. Selector means are connected to the oscillatory circuit to cause the oscillatory circuit to operate at low and high band frequencies respectively. Separate biasing means are provided to bias the transistor at first and second voltage levels respectively, and bias control means are connected to the selector means to connect the appropriate biasing means to the transistor when the selector means adapts the oscillatory circuit to operate at a high band or a low band frequency. The bias control means comprises a switching diode connected between ground and the dividing point of high and low frequency band coils of the oscillatory circuit. A negative voltage source is connected through a high resistance to an end of the low band coil. The selector means comprises a switch controlled by the channel selector shaft of the tuner and is disposed between the end of the low band coil and a power source to control the switching diode such that the transistor bias voltage is regulated in accordance with the mode of operation of the circuit.

11 Claims, 3 Drawing Figures

PATENTED MAY 28 1974 3,813,615

LOCAL OSCILLATOR FOR TELEVISION TUNER HAVING REDUCED OSCILLATION VOLTAGE VARIATION BETWEEN HIGH AND LOW FREQUENCY BANDS

The present invention relates to oscillation circuits for use in television tuners or the like and more particularly to a novel local oscillation circuit wherein variations in the oscillation voltage of the circuit are reduced between high and low band frequency operation.

The gain of a conventional frequency-conversion circuit which utilizes a mixing transistor tends to be decreased when the oscillation voltage of the local oscillator is excessively high or excessively low. Further, conventional local oscillation circuits which utilize variable capacitance diodes tend to be temperature-dependent. The influence of temperature changes are excessive, particularly in the low frequency band where great deviations in the output of the circuit occur as compared to operation in the high frequency band.

More particularly, oscillation voltages in the low frequency band and the high frequency band of conventional local oscillator circuits are found to be much different even if the emitter current in the transistor is maintained at a constant level in the two frequency bands. Thus, when the emitter current is adjusted to a value to create an oscillation voltage adapted to assure an appropriate gain in the frequency conversion circuit during operation in the low frequency band, the oscillation voltage and hence the gain in the frequency conversion circuit are often reduced to an unacceptable level during operation in the high frequency band. Likewise, when the emitter current is adjusted to a value to create an oscillation voltage adapted to produce an appropriate gain in the frequency conversion circuit during operation in the high frequency band, the oscillation voltage and thus the gain in the frequency conversion circuit are often found excessive in the low frequency band.

Because of the above-described disadvantages of local oscillators of the conventional construction, it has been difficult to control channels with the gain maintained at a substantially constant value.

It is therefore the principal object of the present invention to provide a local oscillation circuit having variations in the oscillation voltage of the circuit reduced between high and low band frequency operation.

Another object of the present invention is to provide a local oscillation circuit to be used with a television tuner or the like wherein the emitter current is regulated to accommodate high and low frequency operations such that the variations in the oscillation voltage of the circuit are substantially reduced.

In accordance with the present invention, a local oscillation circuit is provided having substantially reduced variations in the oscillation voltage of the circuit between high and low band frequency operation. The circuit includes a tuning inductance means divided into a low-band coil and a high-band coil, a transistor and means operably connecting the transistor with the inductance means for regulating the output current of the transistor. The regulating means comprises a switching diode connected between the dividing point of the coils and ground. A negative voltage source is connected through a high resistance to an end of the low-band coil. A switch controlled by the channel selector shaft of the tuner is disposed between the end of the low-band coil and a power source.

In the first preferred embodiment of the present invention the biasing voltage of the base of the transistor is controlled by the operation of the switch. The base of the transistor is connected to the diode through a resistor. In low band operation, the switch is opened, reverse biasing the diode to cause a decrease in the biasing voltage. In high band operation, the switch is closed causing the diode to conduct, thus increasing the biasing voltage of the transistor.

In the second embodiment of the present invention it is the collector current which is controlled by the switch. The diode is connected to a point between a collector biasing resistor and the collector of the transistor. In low band operation, the switch is opened, the diode is reverse biased and the biasing resistor drops the collector voltage, decreasing the output of the transistor. In high band operation, the collector current goes through the diode and therefore is decreased only by the forward resistance of the diode which is substantially less than the resistance of the collector biasing resistor.

To the accomplishment of the above and to such other aspects as may hereinafter appear, the present invention relates to a local oscillation circuit as defined in the appended claims and as described in the specification, taken together with the accompanying drawings, wherein like numerals refer to like parts and in which:

Figure 1:
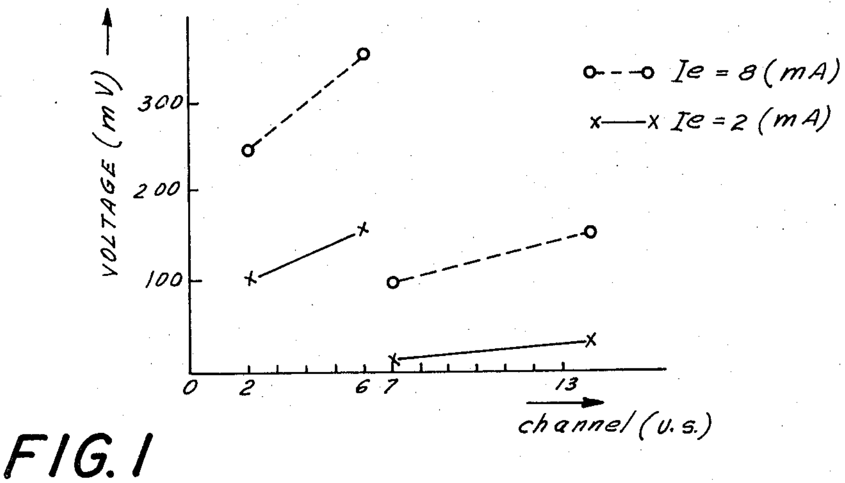
FIG. 1 is a graphical representation of the relationship between the local oscillation voltage and channels with the emiiter current taken as a parameter.

FIG. 1 shows graphically the relationship between the oscillation voltage of a conventional local oscillator and the oscillation frequency expressed as a function of the broadcast channels in the United States, with the emitter current $I_e$ being taken as a parameter. In such a local oscillation circuit, when the emitter current $I_e$ is selected to be 2 mA, the oscillation voltage varies along the solid lines in accordance with the variation in channel frequency. When the emitter current $I_e$ is selected to be 8 mA, the oscillation voltages vary along the broken lines in accordance with the variation of the channel frequency.

In order to achieve an acceptable gain in the frequency conversion circuit, it is desirable to maintain the oscillation voltage of the local oscillation circuit to between 100 and 200 mV. As is apparent from this graph, the oscillation voltage in the case where the emitter current is 2 mA is sufficiently high in the low frequency band (channels 2 through 6) to render an appropriate gain in the frequency conversion circuit. However, in the high frequency band (channels 7 through 13) the oscillation voltage is not sufficiently high, and therefore the gain in the frequency conversion circuit may be too low. On the other hand, in the case where the emitter current $I_e$ is selected to be 8 mA, the oscillation voltage in the high frequency band is suitable for obtaining an appropriate gain in the frequency conversion circuit. However, in the low frequency band, the oscillation voltage will be excessively high, and the gain in the frequency conversion circuit will again be lowered.

This drawback of conventional local oscillation circuits is eliminated in the circuit of the present invention wherein the emitter current $I_e$ is varied such that it is 2 mA for the low frequency band and 8 mA for the high frequency band. Through such regulation, variations in the oscillation voltage of the circuit between high and low band frequency operations are substantially reduced and the gain in the frequency conversion circuit can be stabilized.

Figure 2:
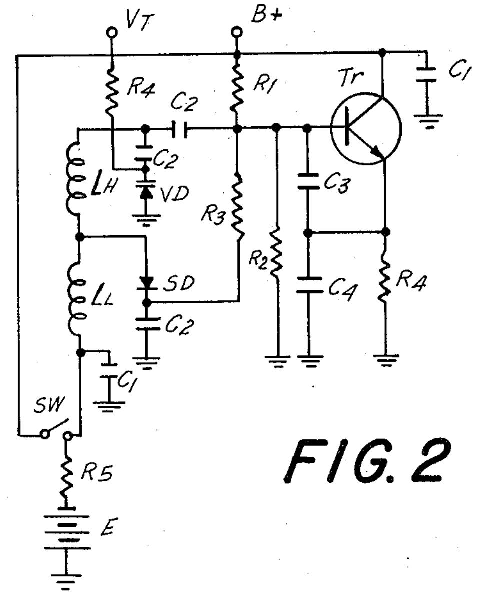
FIG. 2 is a circuit diagram showing the first preferred embodiment of the present invention.

FIG. 2 shows a circuit diagram of the first preferred embodiment of the present invention which can be used as a VHF tuner in a television receiver. In the local oscillation circuit shown here, the tuning inductance means is divided into a low-band coil $L_L$ and a high-band coil $L_H$. A switching diode SD is connected to the dividing point of the coils to enable either of the coils to be selectively operated through the switching diode SD. The cathode of the diode SD is connected through a cathode resistor $R_3$ to the base of the oscillation transistor $T_r$. Furthermore, the other end of the low-band coil (that end which is not connected to the high-band coil) is connected to the negative terminal of a voltage source E through a resistor $R_5$. Resistor $R_5$ has a high resistance value, preferably in the range of 1 megohm. A switch SW connects the power source B+ of the circuit to the junction node between resistor $R_5$ and coil $L_L$.

Power source B+ is also directly connected to the collector of the transistor $T_r$ and to the base of the transistor $T_r$ by means of a bias resistor $R_1$. Resistor $R_2$ connects the base of transistor $T_r$ to ground. Two capacitors, each of which is designated $C_1$, are utilized as grounding capacitors. The capacitors designated $C_2$ are utilized as direct current blocking capacitors. Capacitor $C_3$ is a feedback capacitor and capacitor $C_4$ is a feedback controlling capacitor. A variable capacity diode VD is interposed between resistor $R_4$ and ground. The tuning voltage supply source $V_T$ is connected to regulate the capacity of diode VD.

The switch SW is coupled to the channel selector shaft of the receiver. When the oscillator is operated in the low band (channels 2 through 6) the switch SW is opened and the switching diode SD is reverse biased by negative voltage source E. The tuning inductance comprises the low-band coil $L_L$ and the high-band coil $L_H$ in combination, and the base biasing voltage of transistor $T_r$ is determined by the voltage dividing ratio of the bias resistors $R_1$ and $R_2$.

In the high band operation, the channel selector shaft is positioned to select a high-band channel (channels 7 through 13), the switch SW is closed, and the tuning inductance comprises the high-band coil $L_H$ only. The forward resistance of the switching diode SD (no longer reverse biased) and the resistor $R_3$ connected in series are in effect further connected in parallel to the bias resistor $R_1$. The bias voltage of the base of the transistor $T_r$ is determined by the voltage ratio between this combined resistance and the resistor $R_2$. Thus, the voltage dividing ratio for the bias voltage can be changed by varying the resistors $R_1$, $R_2$, and $R_3$ suitably, and the base bias voltage of transistor $T_r$ can be thereby elevated. The emitter current of the transistor is thus increased, and variations in the oscillation voltage of the circuit between high and low band frequency operations are substantially reduced. The negative voltage source E is connected in series with an extremely high resistance $R_5$, and any possibility of a negative current flowing through the circuit is thereby eliminated.

Figure 3:
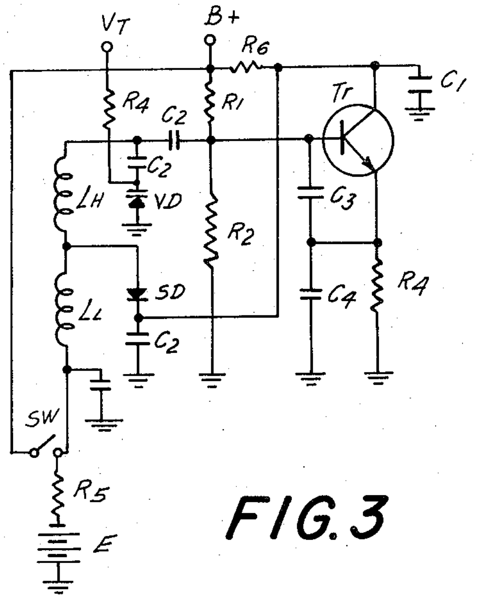
FIG. 3 is a circuit diagram showing the second preferred embodiment of the present invention.

FIG. 3 shows a second preferred embodiment of the present invention. This embodiment is essentially structurally the same as the embodiment previously described, but herein the connection of the switching diode through resistor $R_3$ to the base of transistor $T_r$ is eliminated. Instead of this connection, a collector biasing resistor $R_6$ is connected between the B+ and the collector of transistor $T_r$. The cathode of the switching diode SD is directly connected to the collector side of the collector biasing resistor $R_6$.

In low band operation, the switch is opened, diode SD is reverse biased and the collector voltage supplied from B+ is dropped by the collector biasing resistor $R_6$. However, in the high band operation, the switch is closed, diode SD conducts, and the collector voltage is subjected only to the slight voltage drop caused by the forward resistance of the switching diode SD. Therefore, the collector voltage is significantly elevated over its level in the low band operation. Accordingly, variations in the emitter current between high and low band frequency operations are substantially reduced.

In both of the above-described embodiments, the emitter current for the oscillation transistor can be changed between the high band operation and the low band operation by simply utilizing the forward current of the switching diode effectively, and variations in the oscillation voltage of the circuit between high and low band frequency operations are substantially reduced.

Two preferred embodiments of the present invention have been specifically disclosed herein for purposes of illustration. It is apparent that many modifications and variations may be made upon the specific structure disclosed herein. It is intended to cover all of these variations and modifications which fall within the scope of this invention as defined by the appended claims.

I claim:

1. A local oscillator circuit for a television tuner or the like comprising a transistor and an oscillatory circuit operatively connected thereto, selector means operatively connected to said oscillatory circuit and active to cause said circuit to operate in first and second frequency bands respectively, first and second biasing means adapted to be operatively connected to said transistor to bias the latter at first and second voltage levels respectively, and bias control means operatively connected to said selector means and effective to connect said first and second biasing means respectively to said transistor when said selector means adapts said oscillatory circuit to operate in said first and second frequency bands respectively, thereby to minimize variations in oscillator output amplitude as between one band and the other.

2. The circuit of claim 1 wherein said oscillatory circuit comprises a low band inductance coil and a high band inductance coil, said coils being connected through a node.

3. The circuit of claim 2 wherein said bias control means comprises a diode operably connected between said node and ground, and means for biasing said diode between a conducting state and a nonconducting state.

4. The circuit of claim 3 wherein said diode biasing means comprises a negative voltage source operably connected to the end of said low band inductance coil other than the end connected to said node and a high resistance interposed between said source and said low band inductance coil.

5. The circuit of claim 4 wherein said selector means comprises a switch operably connected between said end of said low band inductance coil and said transistor.

6. The circuit of claim 5 further comprising a rotatable channel selector shaft, the switch being opened or closed in accordance with the rotation of said shaft.

7. The circuit of claim 5 wherein said input current of said transistor is controlled by said switch.

8. The circuit of claim 3 wherein the base of said transistor is operably connected to said diode.

9. The circuit of claim 1 further comprising a power source, a first and a second resistor connected in series between said said power source and ground, the base of said transistor being operably connected between said first and second resistors.

10. The circuit of claim 3 further comprising a power source and wherein said regulating means comprises a resistor for biasing the collector of said transistor, said resistor being connected between said power source and the collector of said transistor.

11. The circuit of claim 10 wherein said diode is operably connected between said biasing resistor and the collector of said transistor such that said biasing resistor is bypassed when said diode is conducting.

* * * * *